(12) United States Patent
Harayama

(10) Patent No.: US 7,692,761 B2
(45) Date of Patent: Apr. 6, 2010

(54) EXPOSURE APPARATUS AND METHOD, AND DEVICE MANUFACTURING METHOD

(75) Inventor: Tomohiro Harayama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 906 days.

(21) Appl. No.: 11/387,821

(22) Filed: Mar. 23, 2006

(65) Prior Publication Data
US 2006/0216650 A1    Sep. 28, 2006

(30) Foreign Application Priority Data
Mar. 25, 2005    (JP)    ............... 2005-088931

(51) Int. Cl.
G03B 27/52    (2006.01)
G03B 27/42    (2006.01)

(52) U.S. Cl. .......................... 355/30; 355/53

(58) Field of Classification Search ................. 355/30, 355/53, 55, 67, 77; 250/548, 492.2, 492.22; 430/311
See application file for complete search history.

(56) References Cited

U.S. PATENT DOCUMENTS 4,565,793 A * 1/1986 Rosensweig .................. 502/74
6,733,244 B1 * 5/2004 Fritsch et al. ................. 417/48
7,050,146 B2 * 5/2006 Duineveld et al. ............ 355/30
7,317,504 B2 * 1/2008 De Smit et al. ............... 355/30

FOREIGN PATENT DOCUMENTS

| JP | 06-124873 | 5/1994 |
| JP | 2002-143885 | 5/2002 |
| WO | WO 99/49504 | 9/1999 |

* cited by examiner

*Primary Examiner*—Hung Henry Nguyen
(74) *Attorney, Agent, or Firm*—Cowan, Liebowitz & Latman, P.C.

(57) ABSTRACT

An exposure apparatus which includes a projection optical system configured to project a pattern of a reticle onto a substrate and exposes the substrate to light via the reticle and the projection optical system with a gap between the projection optical system and the substrate filled with liquid, comprises a liquid immersion system configured to supply the liquid to the gap and to recover the liquid from the gap; and a generator configured to generate at least one of an electric field and magnetic field in a path of the liquid of the liquid immersion system.

10 Claims, 6 Drawing Sheets

EXPOSURE APPARATUS AND METHOD, AND DEVICE MANUFACTURING METHOD

FIELD OF THE INVENTION

The present invention relates to an exposure technique for exposing a substrate to light through a reticle and a projection optical system for projecting a pattern of the reticle onto the substrate with a space between the projection optical system and the substrate immersed in liquid.

BACKGROUND OF THE INVENTION

In a process of manufacturing a highly integrated device such as a semiconductor device or liquid crystal display device, a reduction projection exposure apparatus using a reduction projection optical system to transfer a circuit pattern drawn on an original onto a substrate coated with a photosensitive agent is adopted. To further increase the degree of integration of a semiconductor, an exposure apparatus is demanded to resolve a further micronized pattern. In order to attain high resolution of the exposure apparatus, it is common practice to shorten the exposure wavelength or increase the numerical aperture (NA) of a projection optical system. As the NA increases, the depth of focus DOF decreases. The relationship between these factors can be expressed by:

$$\text{resolution } R = k_1 \lambda / NA$$

$$\text{depth of focus } DOF = \pm k_2 \lambda / NA^2$$

where $\lambda$ is the wavelength of exposure light, NA is the numerical aperture of the projection optical system, and $k_1$ and $k_2$ are process coefficients.

As for the exposure wavelength, an i-line having a wavelength of 365 nm, a KrF excimer laser which emits light having a wavelength of 248 nm, an ArF excimer laser which emits light having a wavelength of 193 nm, and an $F_2$ excimer laser which emits light having a wavelength of 157 nm have been developed, so an increase in resolution of the exposure apparatus has been realized. To achieve a higher resolution in the future, an exposure apparatus using a soft X-ray (also called EUV (Extreme Ultra Violet) Light) having a wavelength of 13.5 nm is also under development.

As for the numerical aperture (NA) of the projection optical system, as disclosed in Japanese Patent Laid-Open No. 06-124873 and WO 99/49504, a liquid immersion method has received a great deal of attention, which fills the region between the exposure target substrate and the exit surface of the projection optical system with a liquid. As is obvious from the above relation and a nature in which the NA is proportional to the refractive index of the region, the resolution of the exposure apparatus is inversely proportional to the refractive index of the region. The liquid immersion method is implemented using this nature. Letting $\lambda_0$, $\lambda_a$, and $\lambda_1$ be the wavelengths and $n_0$, $n_a$, and $n_1$ be the refractive indices of exposure light in a vacuum, air, and an immersion liquid, respectively, the relationship between the resolution $R_1$ and the depth of focus $DOF_1$ in liquid immersion exposure is expressed by:

$$\text{resolution } R_1 = k_1 \lambda_1 / NA = k_1 (\lambda_0 / n_1) NA = k_1 (\lambda_a / n_a) / n_1 NA \approx k_1 \lambda_a / n_1 NA \text{ (from } n_a \approx 1)$$

$$\text{depth of focus } DOF_1 = \pm k_2 \lambda_1 / NA^2 = \pm k_2 (\lambda_0 / n_1) / NA^2 = \pm k_2 (\lambda_a / n_a) / n_1 NA^2 \approx \pm k_2 \lambda_a / n_a NA^2 \text{ (from } n_a \approx 1) = \pm n_1 k_2 \lambda_a / (n_1 NA)^2$$

As is obvious from the above equation, the use of the liquid immersion method increases the resolving power to $1/n_1$ times. This amounts to using exposure light having a wavelength $1/n_1$ times or using a projection optical system having a numerical aperture $n_1$ times without using the liquid immersion method. As for the depth of focus, the use of the liquid immersion method increases it to $n_1$ times that without using the liquid immersion method.

In the above liquid immersion method, an imaging failure may occur when micro-bubbles enter the exposure optical path in an immersion liquid and shield it. Also, since the micro-bubbles burst at a high pressure upon extinction, a photosensitive film may be damaged by the impact of the pressure. By excessively degassing the liquid in a vacuum using a degasser, it is possible to shorten the life of the generated micro-bubbles. However, since the degasser has a structure which requires a space to accommodate, it must be installed at a position largely spaced apart from the substrate. Therefore, micro-bubbles may be generated in the path from the degasser to the substrate when turbulence is generated due to the unevenness of a pipe or nozzle or when a gas is trapped in the liquid in a region where the gas comes into contact with the liquid. As the amount of micro-bubbles generated gets higher than the saturated dissolution amount in the liquid, the generated micro-bubbles remain in the liquid. Even if all the micro-bubbles generated can be dissolved in the liquid, a predetermined time is required for dissolution to occur. Therefore, an imaging failure may occur upon shielding the optical path before dissolution. Also, a photosensitive film may be damaged by the impact of a pressure acting upon extinction of the bubbles.

SUMMARY OF THE INVENTION

The present invention has been made in consideration of the above background, and has as its exemplary object to reduce adverse effects of microbubbles.

In order to solve the above problem and achieve the object, according to the first aspect of the present invention, there is provided an exposure apparatus which includes a projection optical system configured to project a pattern of a reticle onto a substrate and exposes the substrate to light via the reticle and the projection optical system with a gap between the projection optical system and the substrate filled with liquid, comprising: a liquid immersion system configured to supply the liquid to the gap and to recover the liquid from the gap; and a generator configured to generate at least one of an electric field and magnetic field in a path of the liquid of the liquid immersion system.

In the above aspect, the apparatus further comprises a sensor configured to measure an amount of bubbles in the liquid; and a controller configured to control, based on measurement made by the sensor, a field to be generated by the generator.

In the above aspect, the apparatus further comprises a shield configured to shield a field generated by the generator.

In the above aspect, the generator includes an electrode configured to be positively charged and an electrode configured to be negatively charged.

In the above aspect, the generator includes a pair of parallel conductive lines configured so that an electric current flows through each of the pair of parallel conductive lines, an optical axis of the projection optical system being arranged therebetween.

According to the second aspect of the present invention, there is provided a method of exposing a substrate to light via a reticle and a projection optical system configured to project a pattern of the reticle onto the substrate with a gap between the projection optical system and the substrate filled with liquid, comprising: an immersion step of supplying the liquid to the gap and recovering the liquid from the gap; and a generation step of generating at least one of an electric field and magnetic field in a path of the liquid, the path being formed in the immersion step.

In the above aspect, the method further comprises a measurement step of measuring an amount of bubbles in the liquid, wherein the generation step generates at least one of the electric field and magnetic field in accordance with measurement made in the measurement step.

In the above aspect, the method further comprises a step of guiding first and second portions of the liquid to which at least one of the electric field and magnetic field generated in the generation step is applied, separately to two different branched paths.

In the above aspect, the method further comprises a step of applying one of laser light, ultrasound wave, and vibration to a bubble moved by at least one of the electric field and magnetic field generated in the generation step.

According to the third aspect of the present invention, there is provided a method of manufacturing a device, comprising steps of: exposing a substrate to light via a reticle using an exposure apparatus as defined above; developing the exposed substrate; and processing the developed substrate to manufacture the device.

The present invention makes it possible to reduce adverse influences by micro-bubbles.

Other features and advantages besides those discussed above shall be apparent to those skilled in the art from the description of a preferred embodiment of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

Outline of Embodiments

Figure 1:
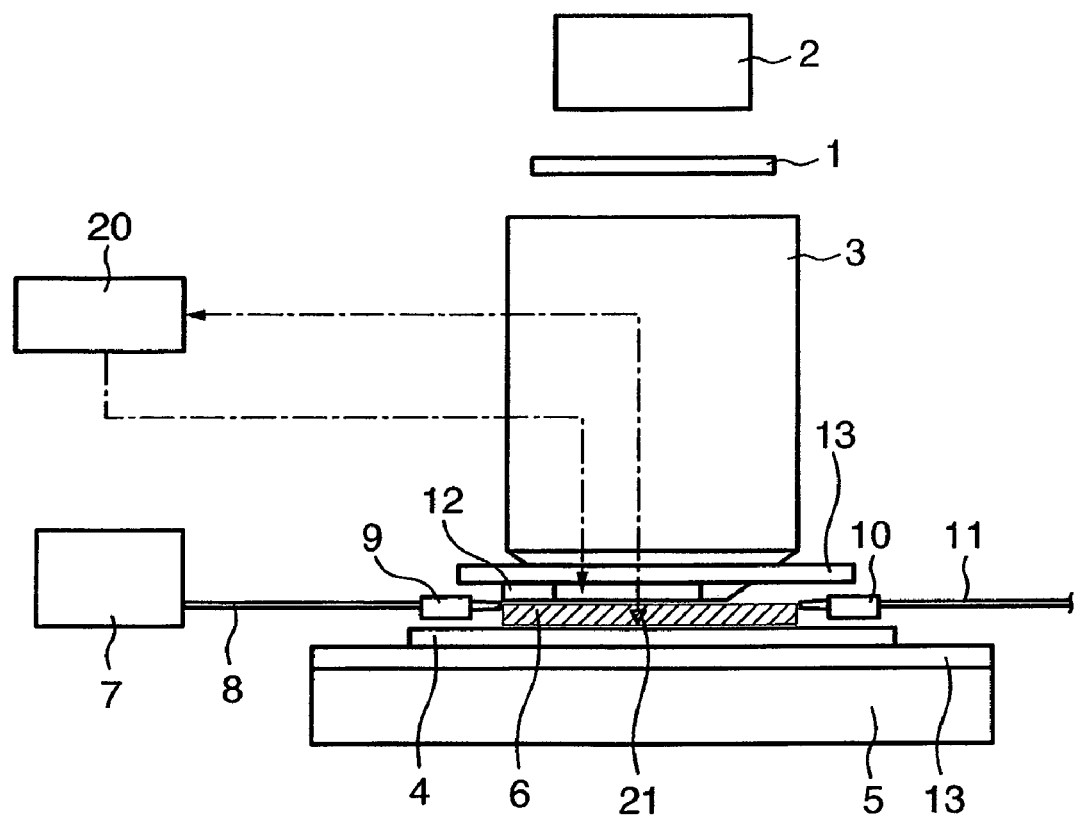
FIG. 1 is a view showing the schematic arrangement including the main part of a liquid immersion exposure apparatus according to the first preferred embodiment of the present invention.

The embodiments have as their object to reduce adverse influences by micro-bubbles in an immersion liquid such as an imaging failure when the micro-bubbles shield the optical path, and damage to a photosensitive film by the impact of a pressure acting upon extinction of the bubbles. To solve this problem, the embodiments are characterized by comprising a means for generating an electric field or magnetic field in the path of the immersion liquid, and changing the distribution of bubbles in the immersion liquid.

As disclosed in Japanese Patent Laid-Open No. 2002-143885, for example, micro-bubbles in a liquid are negatively charged. Therefore, the Coulomb force (electrostatic attraction or electrostatic repulsion) given below acts on each micro-bubble in an electric field:

$$F = q_{mb}q_t/4\pi\epsilon r^2 \text{ or } F = q_{mb}E$$

where

F: the Coulomb force [N] which acts between the micro-bubble and a portion where the electric field is generated
$q_{mb}$: the charge amount [C] of the micro-bubble
$q_t$: the charge amount [C] of the portion where the electric field is generated
$\epsilon$: the permittivity [F/m] of the liquid
r: the distance [m] between the micro-bubble and the portion where the electric field is generated
E: the electric field [V/m]

Also, the Lorentz force given below acts on each micro-bubble in a magnetic field:

$$F = q_{mb}vB$$

where

F: the Lorentz force [N] which acts on the micro-bubble
$q_{mb}$: the charge amount [C] of the micro-bubble
v: the velocity [m/s] of the micro-bubble
B: the magnetic flux density [T]

In this manner, when the Coulomb force or Lorentz force acts on the micro-bubbles in the liquid, it is possible to change the behaviors of the micro-bubbles. An electric field of 1 MV (megavolt) can give a moving velocity of 2.51 nm/s to the bubble. A magnetic field of 10 T (tesla) can give a moving velocity of 0.18 nm/s to the bubble. Controlling to prevent the micro-bubbles from entering the exposure optical path in the immersion liquid using a means for controlling the electric field and magnetic field makes it possible to reduce adverse influences by the micro-bubbles such as an imaging failure when the micro-bubbles shield the optical path, and damage to a photosensitive film by the impact of a pressure acting upon extinction of the bubbles.

To effectively practice the embodiments, a means for measuring a generated electric field and magnetic field is desirably provided to reflect the measured value in the manipulated variable of the control means.

Also, to effectively practice the embodiments, for example, a negatively charged member is arranged before a region in which a immersion liquid passes through the exposure optical path. As described above, micro-bubbles are negatively charged. Therefore, the micro-bubbles receive the Coulomb force which acts to keep them away from the region. In addition, a positively charged member is arranged in a region of the path of the immersion liquid where it is desirable to attract the micro-bubbles. With this arrangement, the micro-bubbles receive the Coulomb force which acts to attract them to the region. In this manner, an electric field is desirably generated depending on the region in the path.

Also, to effectively practice the embodiments, a means for controlling at least one of the path, flow rate, velocity, pressure, and temperature of an immersion liquid is desirably provided.

Also, to effectively practice the embodiments, an electric shield and magnetic shield are desirably provided to prevent an electric field and magnetic field from influencing portions other than micro-bubbles.

Also, to effectively practice the embodiments, a switching valve to make a path branch and control the flow rate in each branching path is desirably provided to make an immersion liquid branch into a liquid portion containing micro-bubbles in large quantities and a liquid portion containing micro-bubbles in small quantities, which liquid portions are generated due to action of an electric field or magnetic field.

Also, to effectively practice the embodiments, the apparatus desirably has a means for applying ultrasound or laser light to bubbles to apply vibration to them so as to extinguish bubbles guided by an electric field or magnetic field or separate bubbles attracted to the wall surface from it.

Embodiments of the present invention will be described in detail below with reference to the accompanying drawings.

Note that the embodiments to be described hereinafter are examples as practice means of the present invention, and should be appropriately modified or changed in accordance with various conditions and the arrangement of an apparatus to which the present invention is applied.

First Embodiment

FIG. 1 is a view showing the schematic arrangement including the main part of a liquid immersion exposure apparatus according to a preferred embodiment of the present invention.

Referring to FIG. 1, a pattern drawn on an original plate 1 is imaged and transferred onto a substrate 4 through a projection optical system 3 with exposure light emitted from an illumination optical system 2. A region which can be exposed at once has an area smaller than that of the substrate. For this reason, to expose the entire substrate, the substrate 4 is placed on a stage 5 which can be driven by a linear motor. A liquid immersion exposure apparatus according to this embodiment fills the region between the exit surface of the projection optical system 3 and the exposure target surface of the substrate 4 with an immersion liquid 6. The immersion liquid 6 is deaerated by a degasser 7, supplied between the substrate 4 and the exit surface of the projection optical system 3 through a liquid supply pipe 8 and liquid supply nozzle 9, and recovered into a liquid recovery pipe 11 through a liquid recovery nozzle 10. The components 7 to 11 form a liquid immersion system.

An electric field generator 12 which generates an electric field is arranged at the peripheral portion of the exit surface of the projection optical system 3. The electric field generator 12 functions to reduce an imaging failure and damage to a photosensitive film. The imaging failure occurs when micro-bubbles suspended in the immersion liquid 6 in the region between the substrate 4 and the exit surface of the projection optical system 3 shield the exposure optical path. The photosensitive film is damaged by the impact of a pressure acting upon extinction of the bubbles.

Figure 2:
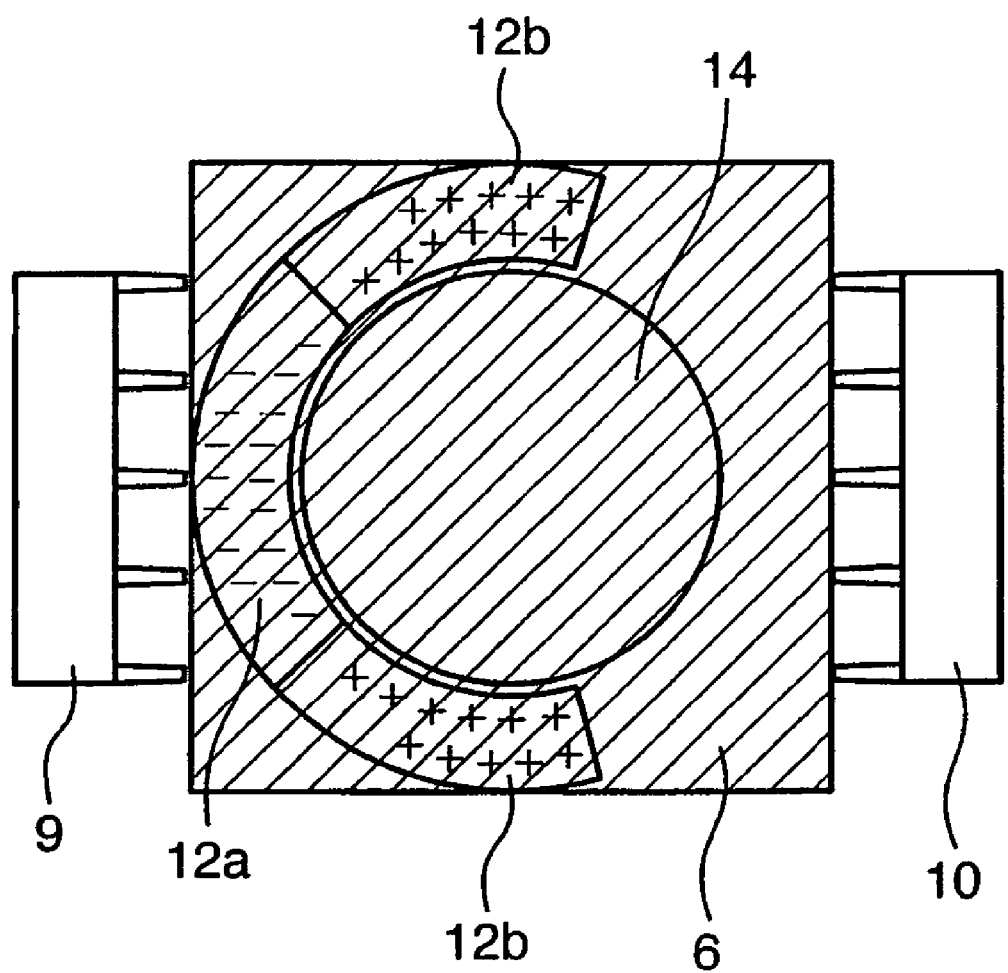
FIG. 2 is a view when the region between the exit surface of a projection optical system and the exposure surface of a substrate in FIG. 1 is viewed from above.

FIG. 2 is a view when the region between the exit surface of the projection optical system 3 and the exposure target surface of a substrate 4 in FIG. 1 is viewed from above. The electric field generator 12 consists of three conductive plate members (electrodes) arranged in an arc around the exit surface of the projection optical system 3. The electric field generator 12 can control to positively or negatively charge each conductive plate member.

The immersion liquid 6 is supplied from the liquid supply nozzle 9, passes through a region below the electric field generator 12 and a region (including a region 14 including the exposure region) below the exit surface of the projection optical system 3, and is recovered from the liquid recovery nozzle 10 opposing the liquid supply nozzle 9. At this time, the electric field generator 12 negatively charges a part 12a with which the immersion liquid 6 which is to flow through the region 14 (the region including the optical axis of the projection optical system) including the exposure region comes into contact before it passes through the region 14. Then, since the micro-bubbles in the immersion liquid 6 are negatively charged, they receive repulsion which acts to keep them away from the plate member 12a. This makes the micro-bubbles difficult to pass near the center of the region 14.

Moreover, the electric field generator 12 positively charges a part 12b which comes into contact with the immersion liquid 6 which is to flow outside the region 14 (by bypassing the projection optical system). Then, the micro-bubbles in the immersion liquid 6 receive attraction which acts to attract them closer to the plate member 12b. This makes the micro-bubbles easy to pass outside the region 14.

As a result, the micro-bubbles in the immersion liquid 6 can hardly enter the region 14. Hence, an imaging failure that occurs when the micro-bubbles shield the optical path, and damage to a photosensitive film by the impact of a pressure acting upon extinction of the bubbles can be reduced.

A measurement means 21 consisting of sensors to measure at least one of the electric field strength and the amount of bubbles in the immersion liquid, and a control means 20 for forming the electric field on the basis of the measurement result to change the behaviors or distribution of bubbles in the immersion liquid are arranged near the electric field generator 12. With this arrangement, the state of the micro-bubbles can be evaluated on the basis of the electric field strength and the bubble amount. Simultaneously, at least one of the path, flow rate, velocity, pressure, and temperature is controlled, thus realizing micro-bubble control with a higher accuracy.

An electric shield 13 made of a material such as copper or silver that is excellent in conductivity surrounds regions (regions above and below the immersion liquid (e.g., partial regions of the projection optical system 3 and the linear motor of the stage 5) which should not be influenced by the electric field. This makes it possible to shield the electric field generated by the electric field generator 12.

Furthermore, when a control means including a switching valve which makes the path branch and controls the flow rate of each branching path is provided, it is possible to make the immersion liquid branch into a liquid portion containing micro-bubbles in large quantities due to action of the electric field and a liquid portion containing micro-bubbles in small quantities due to action of the electric field.

A mechanism which applies ultrasound or laser light to micro-bubbles guided by the electric field to extinguish them or applies vibration to bubbles attracted to the wall surface of the path to separate them from it can also be adopted.

Second Embodiment

Figure 3:
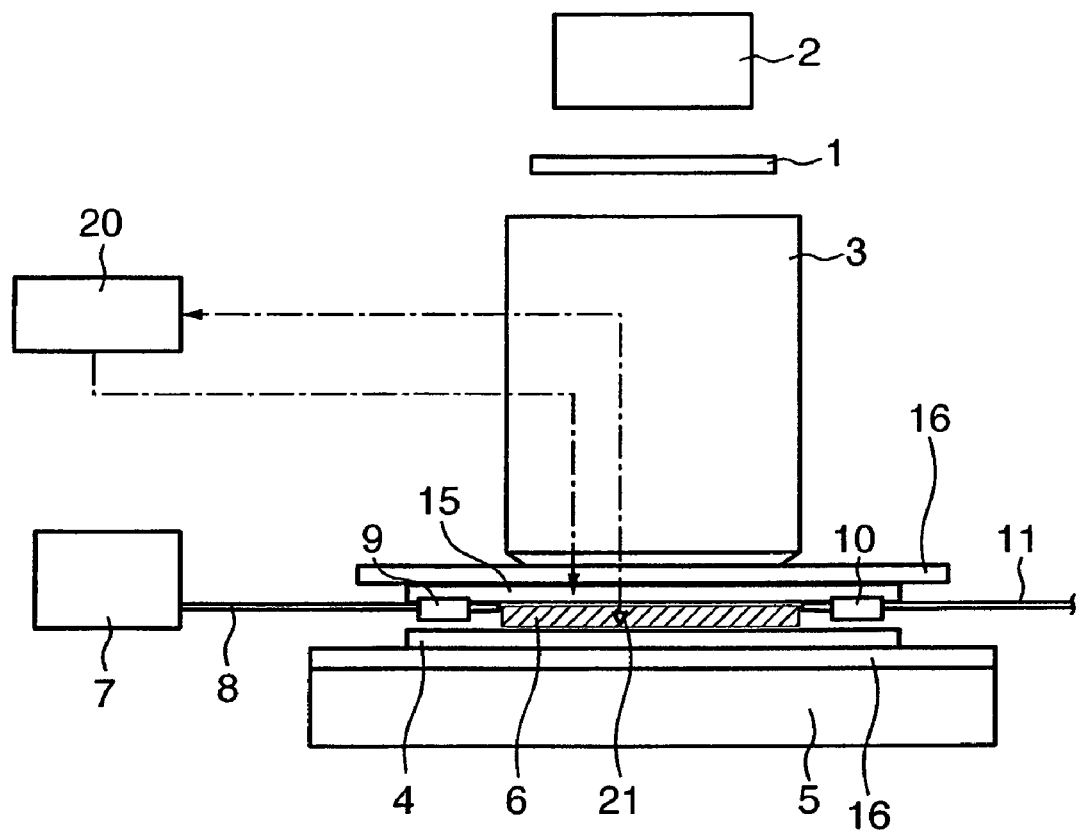
FIG. 3 is a view showing the schematic arrangement including the main part of a liquid immersion exposure apparatus according to the second preferred embodiment of the present invention.

FIG. 3 is a view showing the schematic arrangement including the main part of a liquid immersion exposure apparatus according to a preferred embodiment of the present invention. The same reference numerals (1 to 11) as in FIG. 1 denote the same constituent elements.

In this embodiment, a magnetic field generator 15 is provided in place of the electric field generator 12 in FIG. 1.

Figure 4:
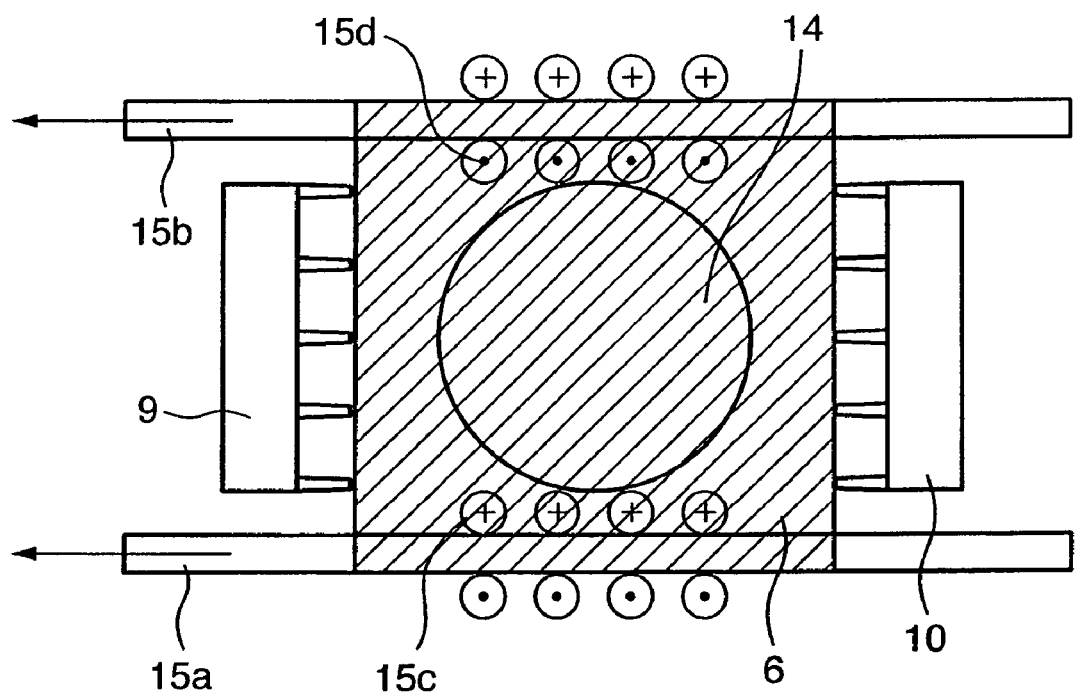
FIG. 4 is a view when the region between the exit surface of a projection optical system and the exposure surface of a substrate in FIG. 3 is viewed from above.

FIG. 4 is a view when the region between the exit surface of a projection optical system 3 and the exposure surface of a substrate 4 in FIG. 3 is viewed from above. On both sides of a liquid supply nozzle 9 and liquid recovery nozzle 10, the magnetic field generator 15 includes a pair of parallel conductive rod-like members 15a and 15b arranged along a direction in which an immersion liquid 6 flows. Electricity can be supplied to the rod-like members 15a and 15b.

The immersion liquid 6 is supplied from the liquid supply nozzle 9, passes through a region below the magnetic field generator 15 and a region (including a region 14 including the exposure region) below the exit surface of the projection optical system 3, and is recovered from the liquid recovery nozzle 10 opposing the liquid supply nozzle 9. An exciting current is then supplied in a direction, as indicated by an arrow, opposite to the direction in which the immersion liquid 6 flows. At this time, a magnetic field is generated around each of the rod-like members 15a and 15b in a direction perpendicular to the direction in which the immersion liquid 6 flows. The magnetic field is right-handed with respect to the exciting current. Hence, in a region 15c around one rod-like member 15a, the magnetic field generates downward to the sheet surface. In a region 15d around the other rod-like member 15b, the magnetic field generates upward to the sheet surface.

Since micro-bubbles in the immersion liquid 6 flow upon carrying negative charges, the Lorentz force acts on them. On the basis of the relationship between the signs of the charge and magnetic field, the micro-bubbles in the immersion liquid 6 receive the Lorentz force which acts in a direction to keep them away from the center of the region 14. As a result, the micro-bubbles in the immersion liquid 6 can hardly enter the exposure region. Hence, an imaging failure that occurs when the micro-bubbles shield the optical path, and damage to a photosensitive film by the impact of a pressure acting upon extinction of the bubbles can be reduced.

A measurement means 21 consisting of sensors to measure the amount of bubbles in the immersion liquid, the charge, or the magnetic field, and a control means 20 for generating the magnetic field on the basis of the measurement result to change the behaviors or distribution of bubbles in the immersion liquid are arranged near the magnetic field generator 15. With this arrangement, the state of the micro-bubbles can be evaluated on the basis of the magnetic field strength and the amount of charge generated. Simultaneously, at least one of the path, flow rate, velocity, pressure, and temperature is controlled, thus realizing micro-bubble control with a higher accuracy.

A magnetic shield 16 made of a material such as permalloy having a high permittivity surrounds regions (regions above and below the immersion liquid (e.g., partial regions of the projection optical system 3 and the linear motor of the stage 5)) which should not be influenced by the magnetic field. This makes it possible to shield the magnetic field generated by the magnetic field generator 15.

As another embodiment, the electric field generator 12 of the first embodiment may be appropriately combined with the magnetic field generator 15 of the second embodiment.

Furthermore, when a control means including a switching valve which makes the path branch and controls the flow rate of each branching path is provided, it is possible to make the immersion liquid branch into a liquid portion containing micro-bubbles in large quantities due to action of the magnetic field and a liquid portion containing micro-bubbles in small quantities due to action of the magnetic field.

A mechanism which applies ultrasound or laser light to micro-bubbles guided by the magnetic field to extinguish them or applies vibration to bubbles attracted to the wall surface of the path to separate them from it can also be adopted.

[Device Manufacturing Method]

Figure 5:
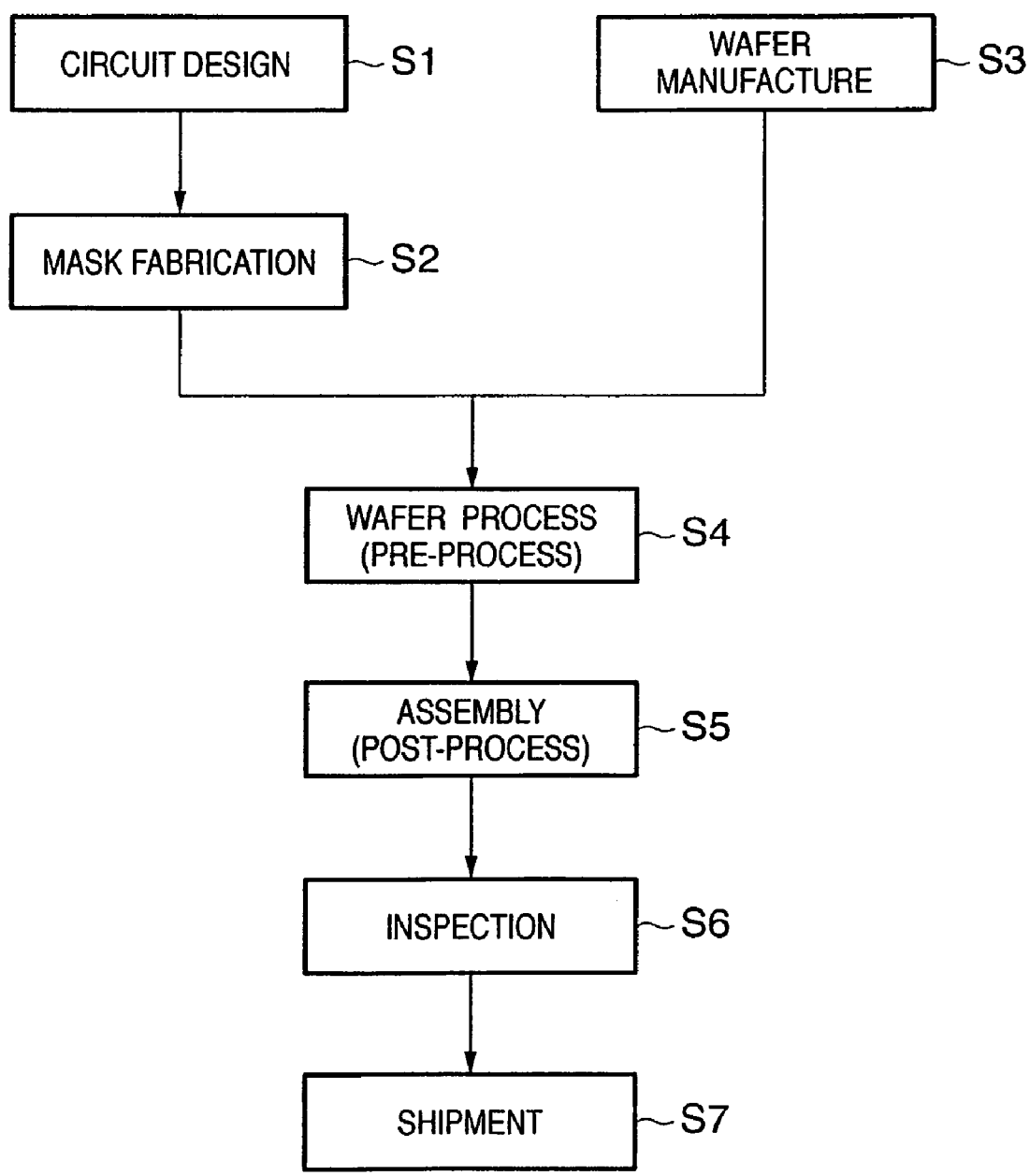
FIG. 5 is a flowchart showing a device manufacturing method.

A semiconductor device manufacturing process using the above exposure apparatus will be described next. FIG. 5 is a flowchart showing the flow of the overall semiconductor device manufacturing process. In step S1 (circuit design), a semiconductor device circuit is designed. In step S2 (mask fabrication), a mask (also called a reticle) is fabricated on the basis of the designed circuit pattern.

In step S3 (wafer manufacture), a wafer is manufactured using a material such as silicon. In step S4 (wafer process) called a pre-process, the above-described exposure apparatus forms an actual circuit on the wafer by lithography using the mask and wafer. In step S5 (assembly) called a post-process, a semiconductor chip is formed by using the wafer manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped in step S7.

Figure 6:
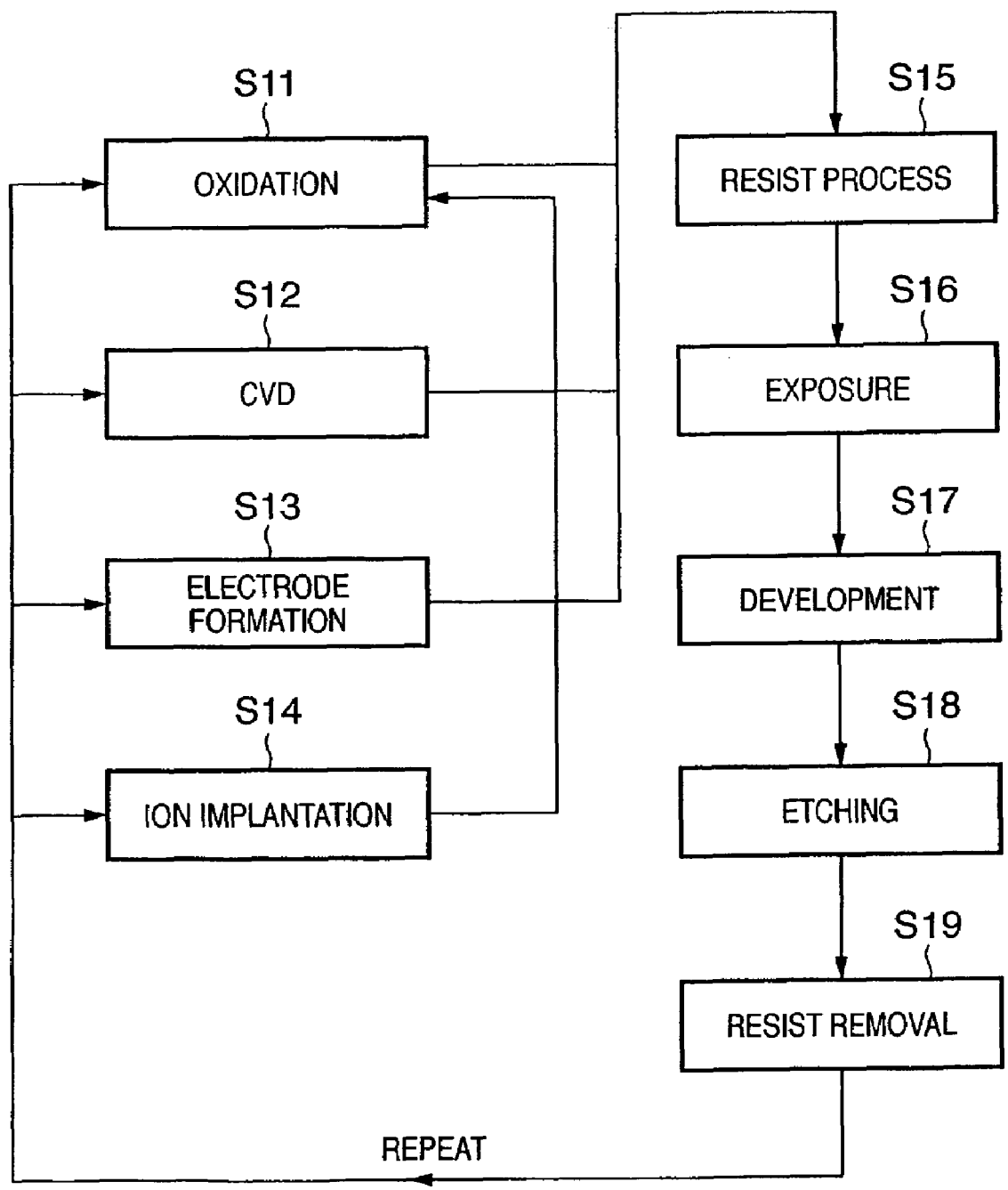
FIG. 6 is a flowchart showing the wafer process.

The semiconductor device process in step S4 includes the following steps (FIG. 6): an oxidation step of oxidizing the wafer surface; a CVD step of forming an insulating film on the wafer surface; an electrode formation step of forming an electrode on the wafer by vapor deposition; an ion implantation step of implanting ions in the wafer; a resist processing step of applying a photosensitive agent to the wafer; an exposure step of causing the above-described exposure apparatus to expose the wafer having undergone the resist processing step through the mask on which the circuit pattern is formed; a development step of developing the wafer exposed in the exposure step; an etching step of etching portions other than the resist image developed in the development step; and a resist removal step of removing any unnecessary resist remaining after etching. By repeating these steps, a multilayered structure of circuit patterns is formed on the wafer.

The present invention is not limited to the above embodiment, and various changes and modifications can be made thereto within the spirit and scope of the present invention. Therefore, to apprise the public of the scope of the present invention, the following claims are made.

This application claims the benefit of Japanese Patent Application No. 2005-088931, filed Mar. 25, 2005, which is hereby incorporated by reference herein in its entirety.

What is claimed is:

1. An exposure apparatus which includes a projection optical system configured to project a pattern of a reticle onto a substrate and exposes the substrate to light via the reticle and the projection optical system with a gap between said projection optical system and the substrate filled with liquid, said apparatus comprising:

a liquid immersion system configured to supply the liquid to the gap and to recover the liquid from the gap; and a generator configured to generate magnetic field in a path of the liquid of said liquid immersion system so that micro-bubbles having a negative electric charge in the liquid receive a Lorentz force which acts in a direction to keep them away from a center of an exposure region by supplying an electric current through a pair of parallel conductive rod members in a direction opposite to a direction in which the liquid flows, wherein the rod members are arranged along a direction in which the liquid flows.

2. An apparatus according to claim 1, further comprising:
a sensor configured to measure an amount of bubbles in the liquid; and a controller configured to control, based on measurement made by said sensor, a field to be generated by said generator.

3. An apparatus according to claim 1, further comprising a shield configured to shield a field generated by said generator.

4. An apparatus according to claim 1, wherein said generator includes an electrode configured to be positively charged and an electrode configured to be negatively charged.

5. An apparatus according to claim 1, wherein an optical axis of said projection optical system is arranged between the pair of parallel conductive rod members.

6. A method of exposing a substrate to light via a reticle and a projection optical system configured to project a pattern of the reticle onto the substrate with a gap between the projection optical system and the substrate filled with liquid, said method comprising:

an immersion step of supplying the liquid to the gap and recovering the liquid from the gap; and a generation step of generating a magnetic field in a path of the liquid, the path being formed in said immersion step, so as to attract bubbles having a negative electric charge in the liquid receive a Lorentz force which acts in a direction to keep then away from the center of an exposure region by supplying an electric current through a pair of parallel conductive rod members in a direction opposite to a direction in which the liquid flows, wherein the rod members are arranged along a direction in which the liquid flows.

7. A method according to claim 6, further comprising a measurement step of measuring an amount of bubbles in the liquid, wherein said generation step generates the magnetic field in accordance with measurement made in said measurement step.

8. A method according to claim 6, further comprising a step of guiding first and second portions of the liquid to which the magnetic field generated in said generation step is applied, separately to two different branched paths.

9. A method according to claim 6, further comprising a step of applying one of laser light, ultrasound wave, and vibration to a bubble moved by magnetic field generated in said generation step.

10. A method of manufacturing a device, said method comprising steps of:

exposing a substrate to light via a reticle using an exposure apparatus as defined in claim 1;

developing the exposed substrate; and processing the developed substrate to manufacture the device.

* * * * *